(12) United States Patent
Lee et al.

(10) Patent No.: US 10,034,368 B2
(45) Date of Patent: Jul. 24, 2018

(54) FLYING TAIL TYPE RIGID-FLEXIBLE PRINTED CIRCUIT BOARD

(71) Applicant: Samsung Electro-Mechanics Co., Ltd., Suwon-si (KR)

(72) Inventors: Yang Je Lee, Cheongju-si (KR); Jae Ho Shin, Daejeon (KR); Ha Il Kim, Seoul (KR); Dek Gin Yang, Cheongju-si (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 0 days.

(21) Appl. No.: 15/285,390

(22) Filed: Oct. 4, 2016

(65) Prior Publication Data

US 2017/0027055 A1 Jan. 26, 2017

Related U.S. Application Data

(63) Continuation of application No. 13/771,830, filed on Feb. 20, 2013.

(30) Foreign Application Priority Data

Feb. 21, 2012 (KR) .......................... 10-2012-0017509

(51) Int. Cl.
*H05K 1/00* (2006.01)
*H05K 1/02* (2006.01)
(Continued)

(52) U.S. Cl.
CPC .......... *H05K 1/0278* (2013.01); *H05K 1/0298* (2013.01); *H05K 3/4652* (2013.01);
(Continued)

(58) Field of Classification Search
CPC ............... H05K 1/0278; H05K 3/4691; H05K 2201/058; H05K 3/4635; H05K 1/189;
(Continued)

(56) References Cited

U.S. PATENT DOCUMENTS 3,409,732 A 11/1968 Dahlgren et al.
4,931,134 A 6/1990 Hatkevitz et al.
(Continued)

FOREIGN PATENT DOCUMENTS

CN 1728923 A 2/2006
CN 1780532 A 5/2006
(Continued)

OTHER PUBLICATIONS

Korean Notice of Allowance dated Feb. 28, 2013 in counterpart Korean Application No. 10-2012-0017509. (6 pages in Korean).
(Continued)

*Primary Examiner* — Steven T Sawyer
(74) *Attorney, Agent, or Firm* — NSIP Law

(57) ABSTRACT

The present invention relates to a method of manufacturing a flying tail type rigid-flexible printed circuit board and a flying tail type rigid-flexible printed circuit board manufactured by the same and implement a flying tail type rigid-flexible printed circuit board with improved filling property by providing a method of manufacturing a flying tail type rigid-flexible printed circuit board including: providing a base substrate having a first inner circuit pattern layer on both surfaces; laminating a first insulating layer on a rigid domain R of the base substrate; laminating at least one circuit layer, which extends over the entire domain of the base substrate, on the first insulating layer; and removing a portion of the circuit layer, which corresponds to a flexible domain F, wherein the circuit layer includes a second insulating layer and a flying tail type rigid-flexible printed circuit board manufactured by the same.

6 Claims, 10 Drawing Sheets

(51) Int. Cl.
  *H05K 3/46* (2006.01)
  *H05K 1/11* (2006.01)
  *H05K 3/00* (2006.01)
  *H05K 3/42* (2006.01)

(52) U.S. Cl.
  CPC ........... *H05K 3/4691* (2013.01); *H05K 1/115* (2013.01); *H05K 3/0032* (2013.01); *H05K 3/0047* (2013.01); *H05K 3/429* (2013.01)

(58) Field of Classification Search
  CPC ...... H05K 3/4652; H05K 3/4611; H05K 3/36; H05K 3/361
  See application file for complete search history.

(56) References Cited

U.S. PATENT DOCUMENTS

| | | | |
|---|---|---|---|
| 5,206,463 | A | 4/1993 | Demaso et al. |
| 5,219,292 | A | 6/1993 | Dickirson et al. |
| 5,262,594 | A | 11/1993 | Edwin et al. |
| 5,499,444 | A | 3/1996 | Doane et al. |
| 2005/0000729 | A1 | 1/2005 | Iljima et al. |
| 2006/0019075 | A1 | 1/2006 | Myoung et al. |
| 2006/0101640 | A1 | 5/2006 | Lee et al. |
| 2006/0213683 | A1 | 9/2006 | Myoung et al. |
| 2006/0281343 | A1 | 12/2006 | Uchida et al. |
| 2007/0090894 | A1 | 4/2007 | Phan et al. |
| 2007/0117261 | A1 | 5/2007 | Ueno et al. |
| 2007/0126123 | A1 | 6/2007 | Sawachi |
| 2008/0014768 | A1 | 1/2008 | Lee et al. |
| 2008/0286696 | A1 | 11/2008 | Ueno et al. |
| 2009/0139750 | A1 | 6/2009 | Kani |
| 2009/0229876 | A1 | 9/2009 | Takahashi |
| 2011/0005811 | A1 | 1/2011 | Yamato |
| 2011/0075374 | A1 | 3/2011 | Kang et al. |
| 2011/0094776 | A1 | 4/2011 | Lee et al. |

FOREIGN PATENT DOCUMENTS

| | | |
|---|---|---|
| CN | 101193505 A | 6/2008 |
| CN | 101658081 A | 2/2010 |
| EP | 2187720 A1 | 5/2010 |
| JP | 7-212044 | 8/1995 |
| JP | 2007-220735 A | 8/2007 |
| JP | 2008-311544 A | 12/2008 |
| KR | 10-0722621 | 5/2007 |
| KR | 10-2009-0057817 A | 6/2009 |
| KR | 10-2010-0028214 A | 3/2010 |
| KR | 10-0993318 | 11/2010 |
| KR | 10-1009072 | 1/2011 |
| KR | 10-1051491 | 7/2011 |

OTHER PUBLICATIONS

Korean Office Action dated Feb. 18, 2014 in counterpart Korean Application No. 10-2012-0017509. (2 pages in Korean).

Chinese Office Action dated Apr. 22, 2015 in counterpart Chinese Application No. 2013100548967. (13 pages with English Translation).

Chinese Office Action dated Jan. 26, 2018 in corresponding Chinese Patent Application No. 201610096233.5 (10 pages in English, 8 pages in Chinese).

[FIG. 1]
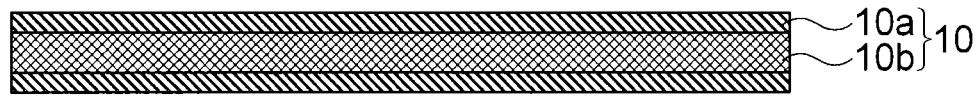
[FIG. 2]
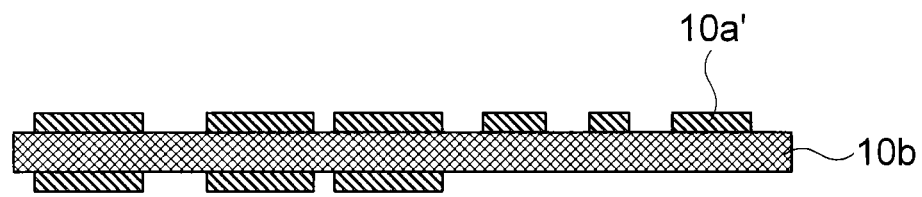
[FIG. 3]
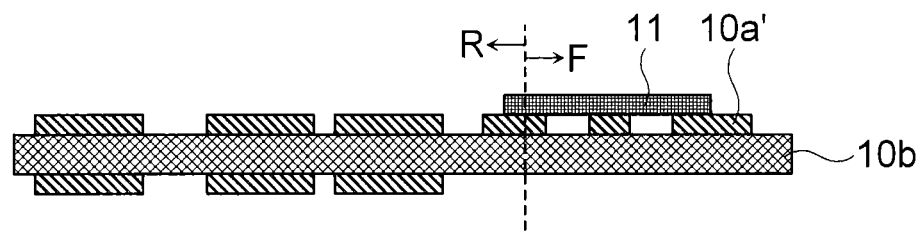
[FIG. 4]
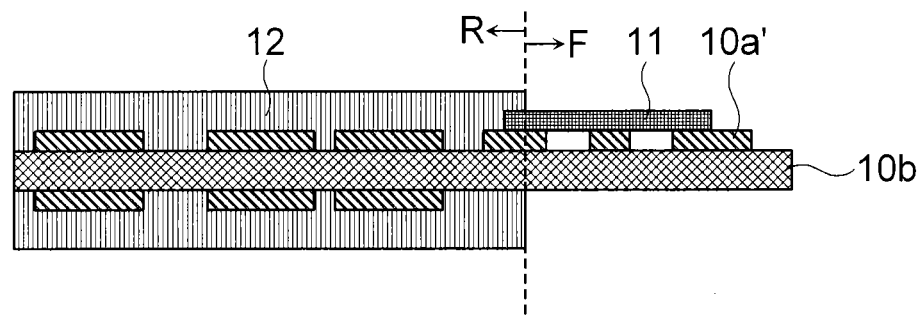
[FIG. 5]
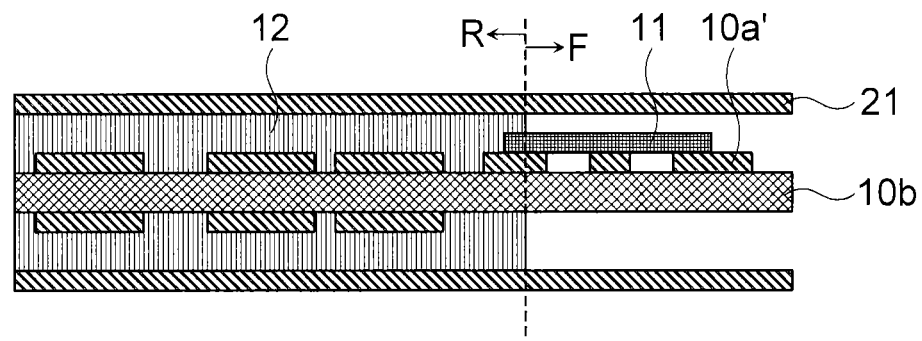

[FIG. 6]
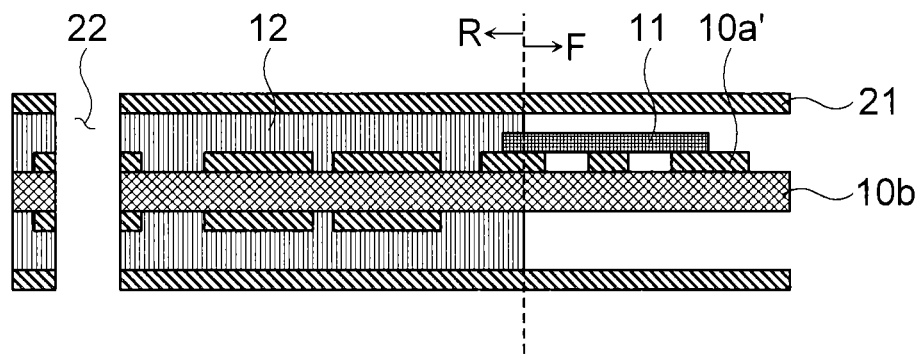
[FIG. 7]
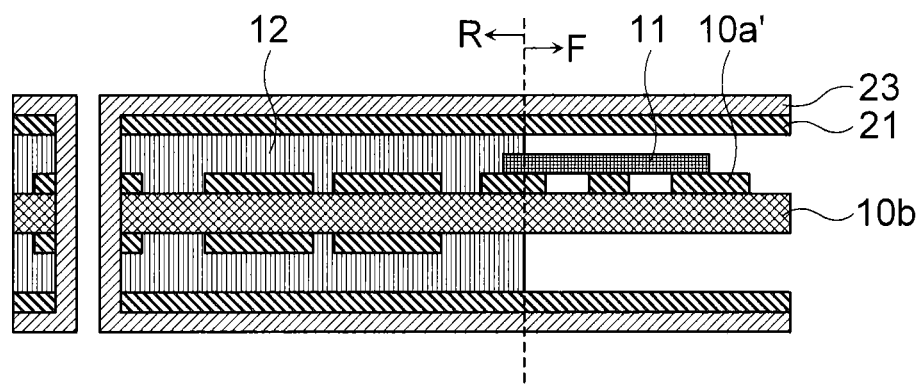
[FIG. 8]
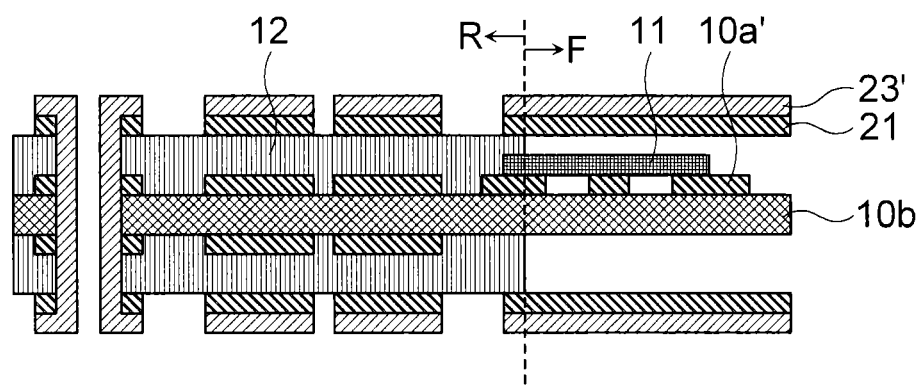

[FIG. 9]
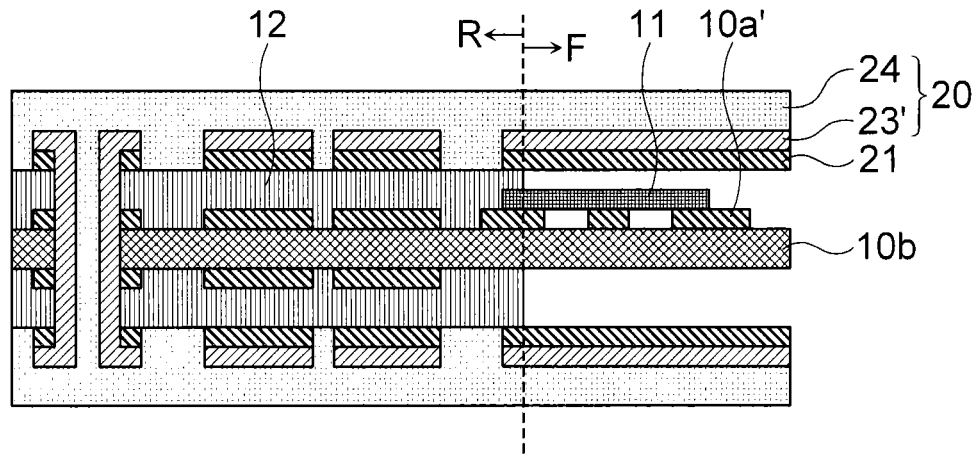
[FIG. 10]
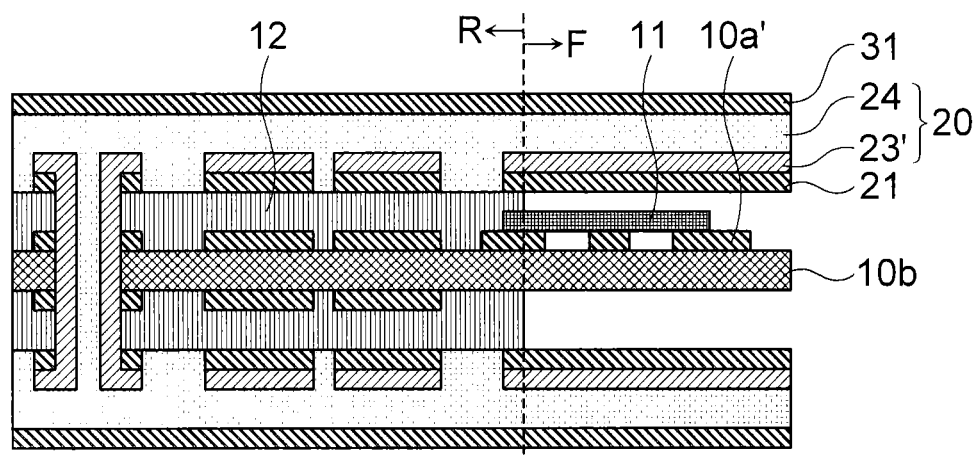
[FIG. 11]
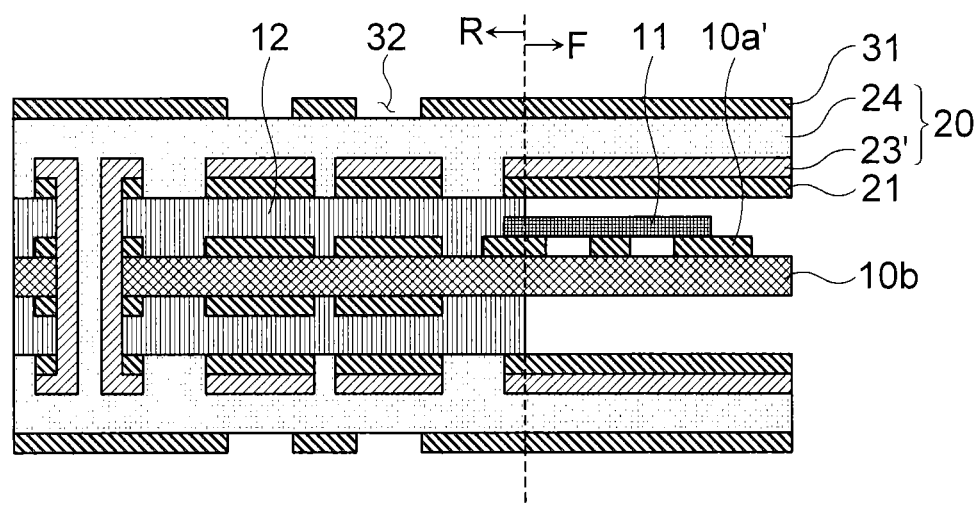

[FIG. 12]
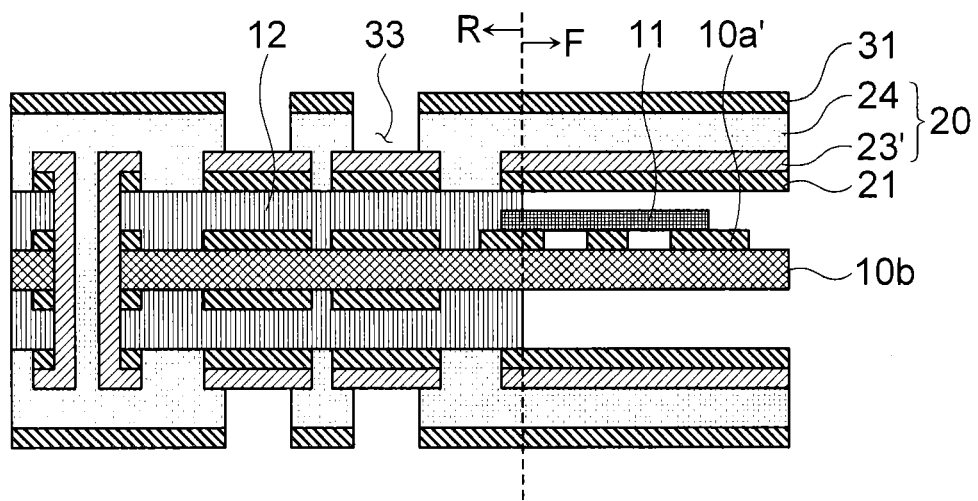
[FIG. 13]
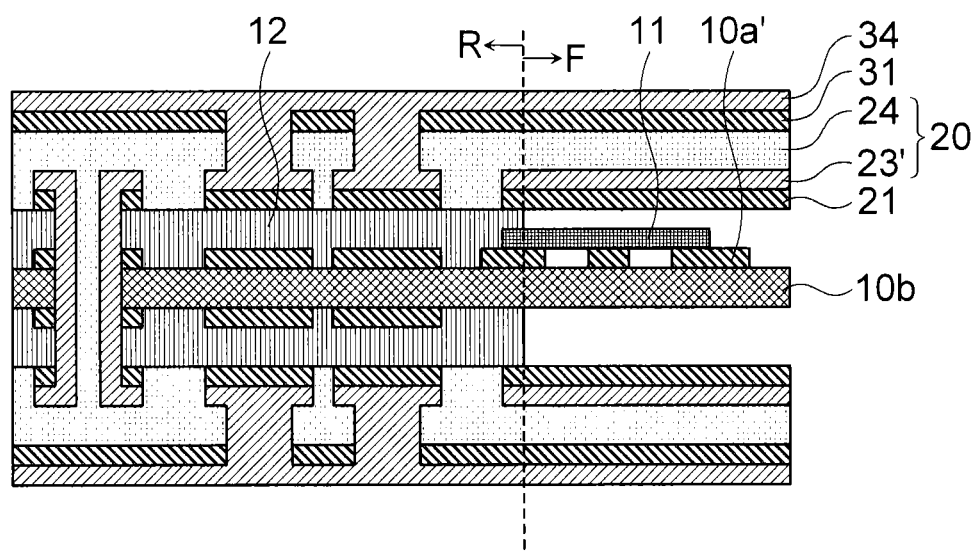

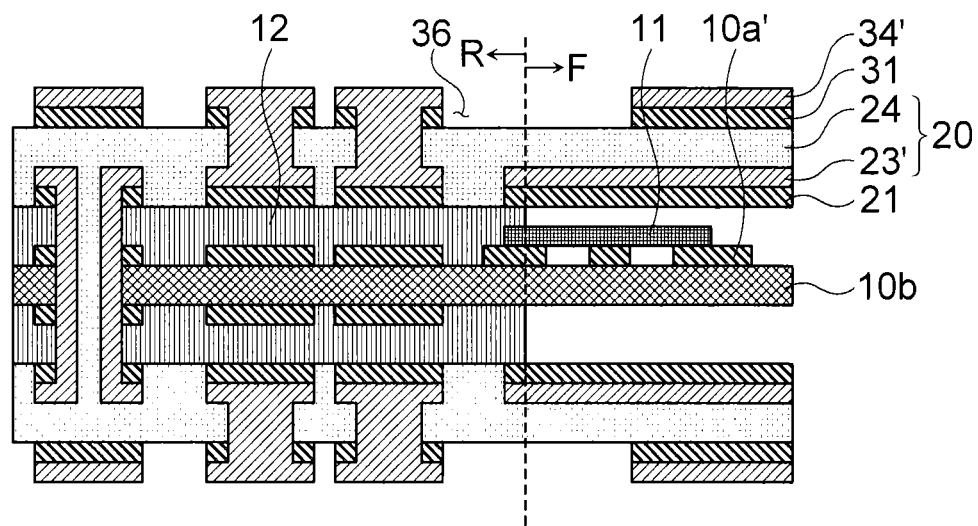
[FIG. 14]
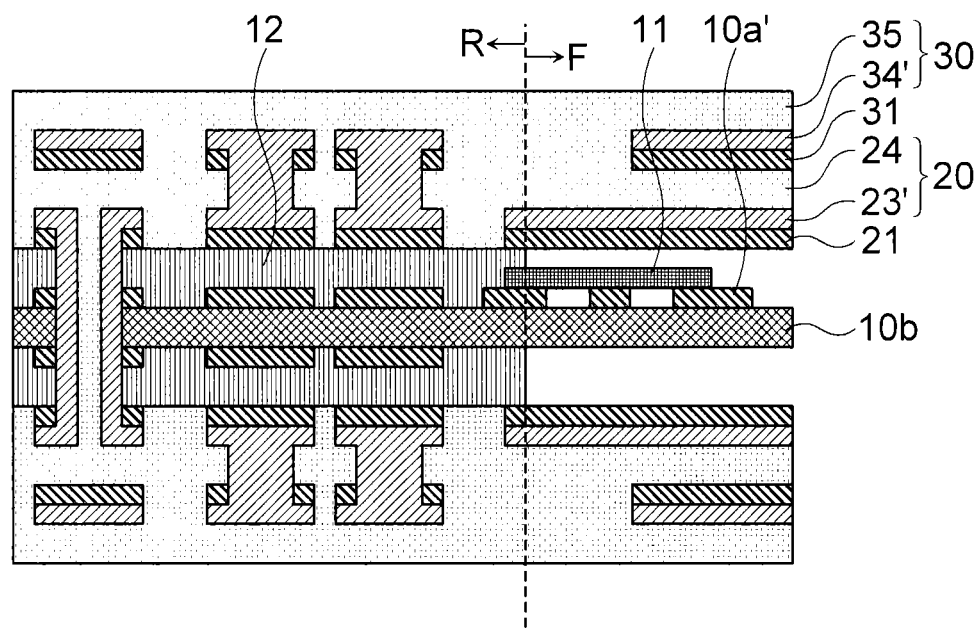
[FIG. 15]

[FIG. 16]
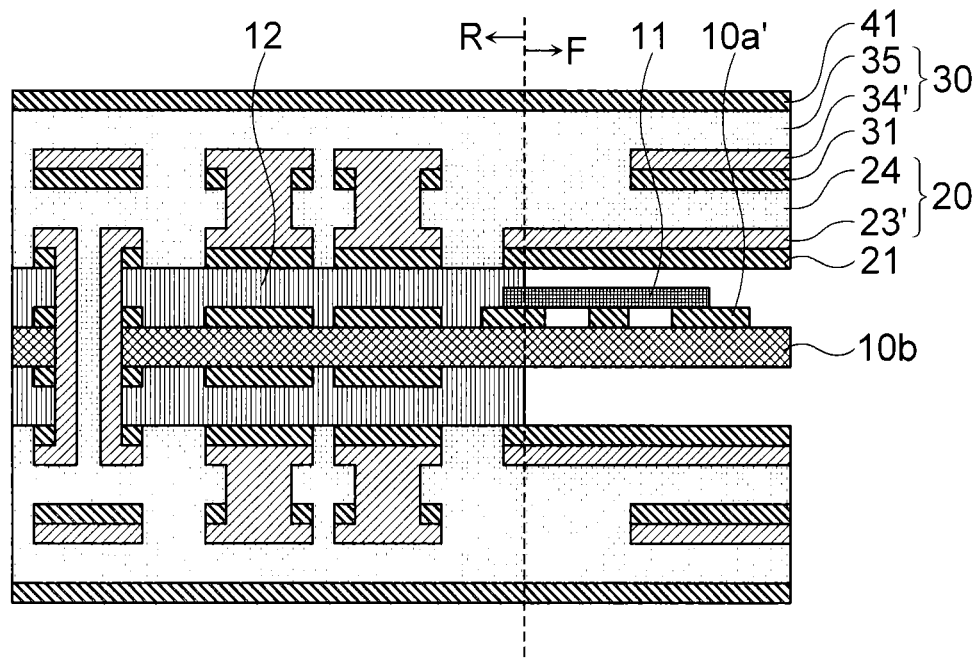
[FIG. 17]
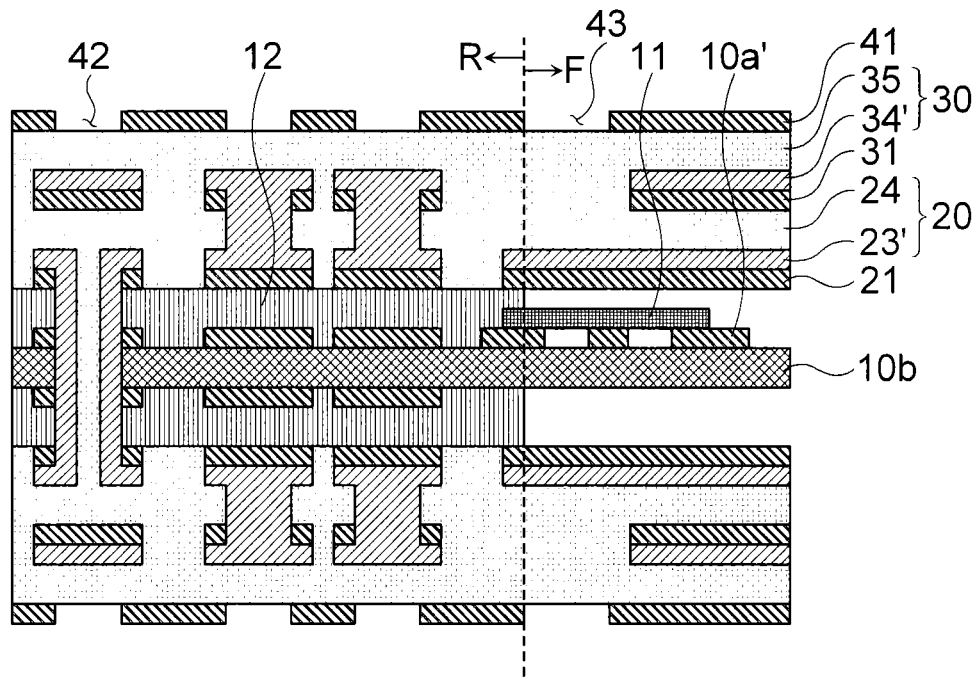

[FIG. 18]
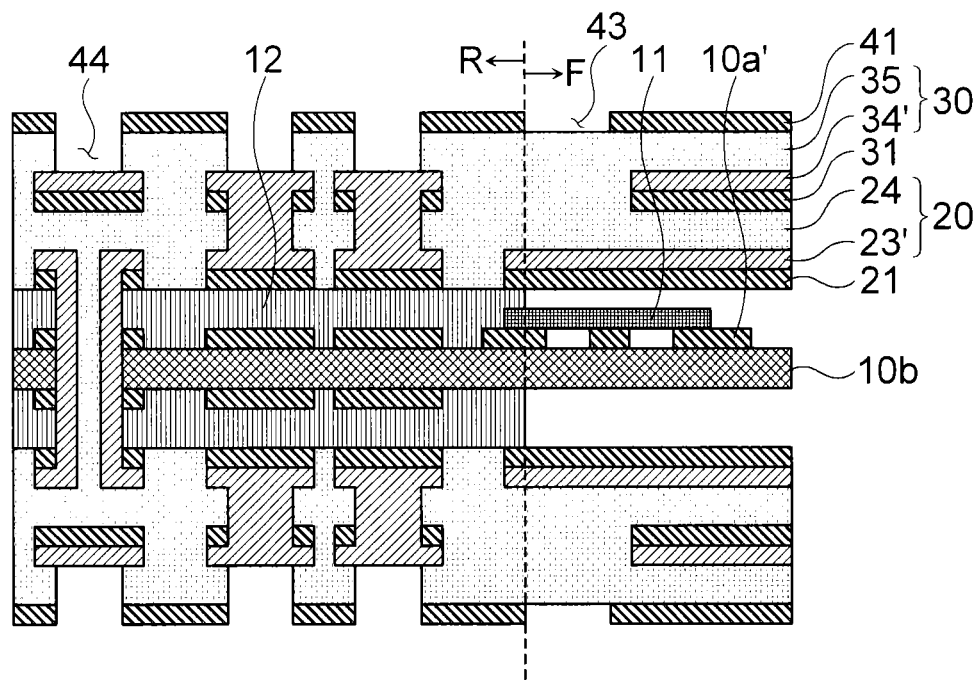
[FIG. 19]
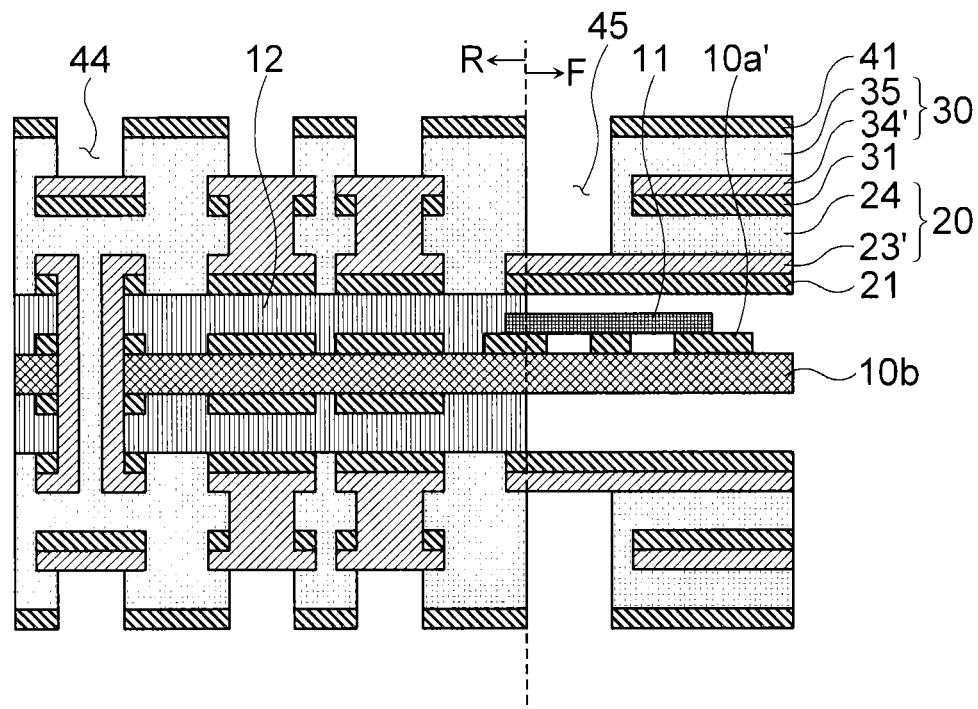

[FIG. 20]
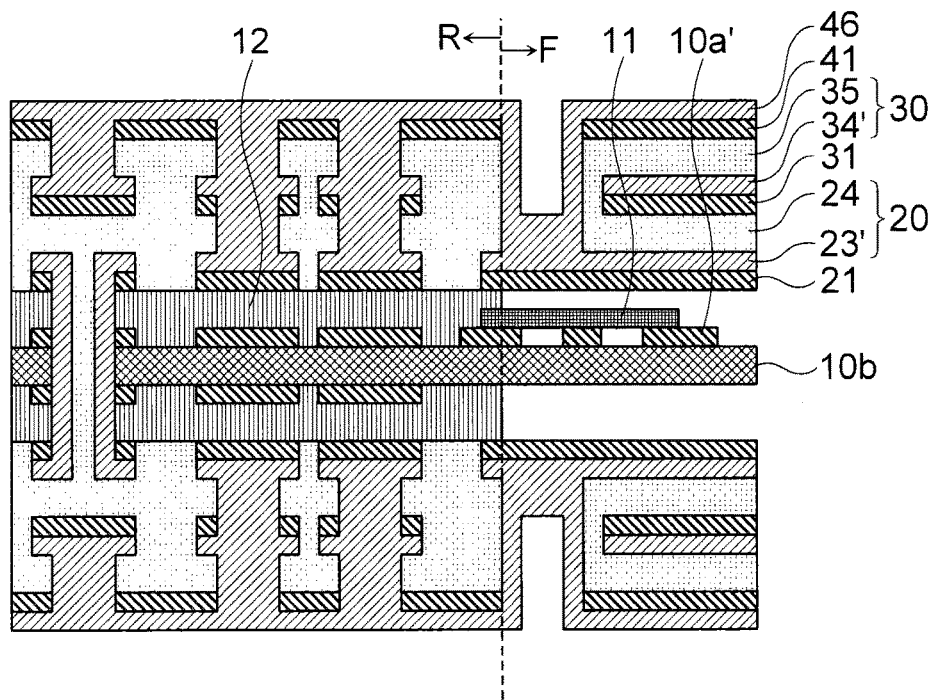
[FIG. 21]
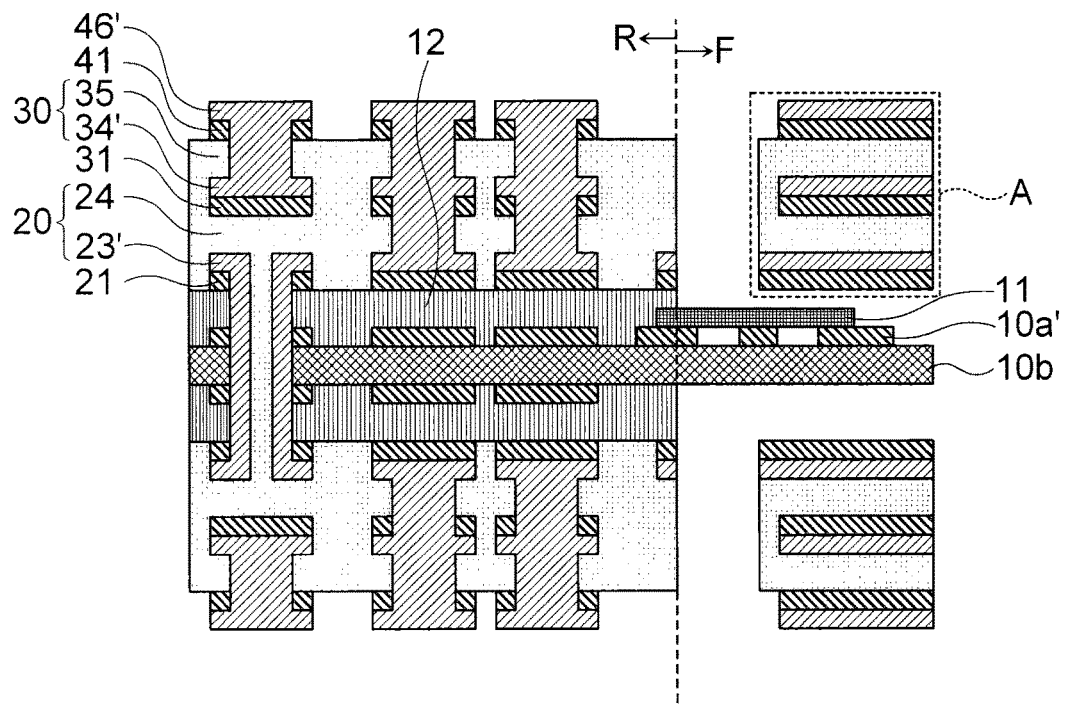

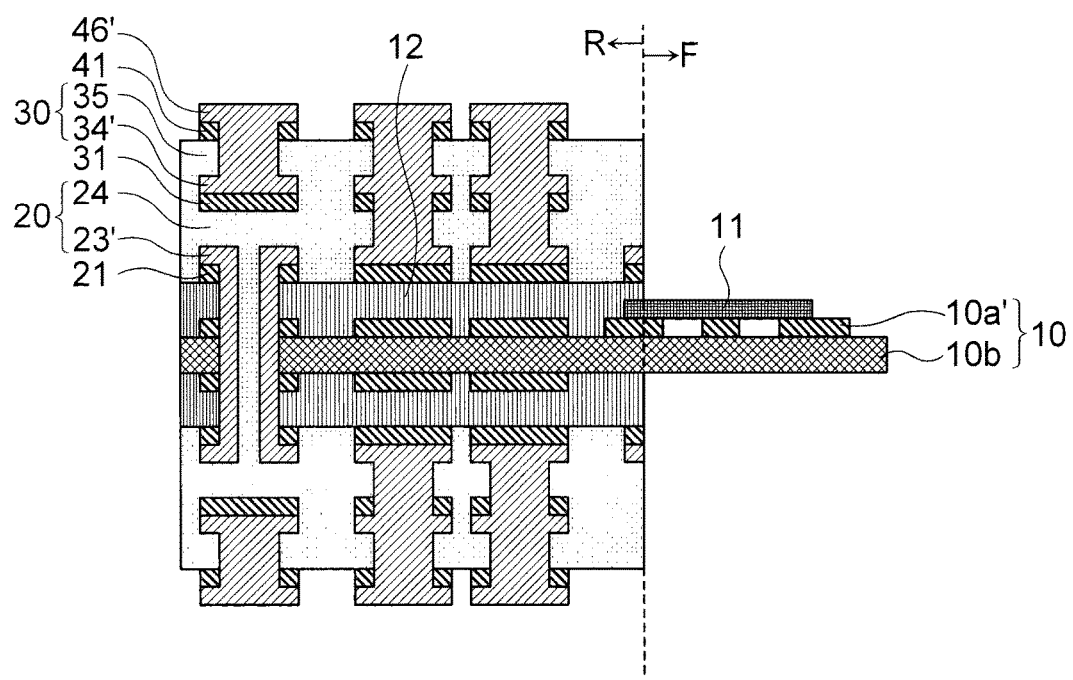
[FIG. 22]

FLYING TAIL TYPE RIGID-FLEXIBLE PRINTED CIRCUIT BOARD

This application is a Continuation of U.S. patent application Ser. No. 13/771,830 filed on Feb. 20, 2013, which claims benefit under 35 U.S.C. § 119(a) of Korean Patent Application No. 10-2012-0017509 filed Feb. 21, 2012, in the Korean Intellectual Property Office, the contents of all of which are incorporated herein by reference in their entireties.

BACKGROUND OF THE INVENTION

1. Field of the Invention

The present invention relates to a method of manufacturing a flying tail type rigid-flexible printed circuit board and a flying tail type rigid-flexible printed circuit board manufactured by the same, and more particularly, to a method of manufacturing a flying tail type rigid-flexible printed circuit board using a flexible insulator and a flying tail type rigid-flexible printed circuit board manufactured by the same.

2. Description of the Related Art

In recent times, as the degree of integration of semiconductor elements is gradually increasing, the number of pads provided on the semiconductor elements to connect the semiconductor elements to external circuits is increasing and mounting density is also on an increasing trend. For example, when a minimum processing dimension of the semiconductor element made of silicon is about 0.2 µm, it is required to provide about 1000 pads on the semiconductor element with a size of about 10 mm.

Further, in semiconductor devices such as semiconductor packages, on which the semiconductor elements are mounted, miniaturization and thinning are needed to improve the mounting density, and particularly, in order to respond to portable information devices such as notebook personal computers (PCs), PDAs, and mobile phones, miniaturization and thinning of the semiconductor packages are needed.

In order to package the semiconductor element, it is required to connect the pad of the semiconductor element to a pad of a wiring substrate as well as mounting the semiconductor element on the wiring substrate. However, when about 1000 pads are provided around the semiconductor element with a size of about 10 mm, they are provided with a very fine pitch of about 40 µm. In order to connect the pads provided with a fine pitch to the pad provided on the wiring substrate, since very high accuracy is required for wiring on the wiring substrate or positioning upon connection, it is very difficult to apply a conventional wire bonding or tape automated bonding (TAB) technique.

Accordingly, recently, various multilayer printed circuit boards, which can mount electronic components on surfaces thereof, have been developed according to miniaturization and integration of the electronic components, and particularly, active researches on a flying tail type rigid-flexible printed circuit board, which can minimize a space occupied by a printed circuit board and be three-dimensionally and spatially transformed, are in progress.

This flying tail type rigid-flexible printed circuit board, which consists of a rigid domain (hereinafter, R) having mechanical strength due to an embedded insulating layer and a flexible domain (hereinafter, F) that connects the rigid domains R to each other and has elasticity, is mainly used in small terminals, such as mobile phones, requiring high integration by removing an unnecessary space due to use of a connector in response to demands for high integration and fine pitches of mounted components according to high functionality of mobile devices.

When looking into a conventional method of manufacturing a flying tail type rigid-flexible printed circuit board, first, a first inner circuit pattern layer is formed on one or both surfaces of a base substrate, and a coverlay is attached to the inner layer circuit pattern layer of a flexible domain F (step S1).

Next, a first insulating layer is laminated on a rigid domain R, and a first metal layer is laminated on the first insulating layer including the flexible domain F (step 82).

At this time, it is preferred that the first insulating layer is made of a cured insulator so that the first insulating layer is not laminated on the flexible domain F. Since the first metal layer is laminated on the first insulating layer and the first insulating layer is not laminated on the flexible domain F, the first metal layer is formed not to be in contact with the coverlay.

Next, a first window is processed by removing the first metal layer in a blind via-hole forming domain, which is to be formed in the rigid domain R (step 83).

Next, a blind via-hole is processed by processing the first insulating layer, which is exposed by the first window, with $CO_2$ laser (step 84).

Next, a through-hole, which penetrates the entire first insulating layer and base substrate, is processed using a CNC drill (step 85).

Next, a first plating layer is formed on the first metal layer including inner walls of the blind via-hole and the through-hole (step 86).

Next, a first circuit pattern layer is formed by patterning the first metal layer and the first plating layer (step 87). At this time, the first metal layer and the first plating layer formed in the flexible domain F are removed.

Next, a second insulating layer is laminated on the rigid domain R, and a second metal layer is laminated on the second insulating layer including the flexible domain F (step 88). At this time, like the above step 82, it is preferred that the first insulating layer is made of a cured insulator so that the first insulating layer is not laminated on the flexible domain F.

Next, a via-hole is processed (step 89). At this time, the via-hole is formed by processing the second insulating layer, which is exposed by a second window, with $CO_2$ laser after processing the second window by removing the second metal layer in a domain in which the via-hole is to be processed.

Next, a second plating layer is formed on the second metal layer including the via-hole (step 810).

Next, a second circuit pattern layer is formed by patterning the second metal layer and the second plating layer (step 811). At this time, like the step 87, the second metal layer and the second plating layer formed in the flexible domain F are removed.

Finally, a third insulating layer is laminated on the rigid domain R, a third metal layer is laminated on the third insulating layer including the flexible domain F, and a third circuit pattern layer is formed (step 812). That is, since this step, a step of forming a third build-up layer, is equal to a method of forming a first build-up layer or a second build-up layer, repeated description will be omitted.

Like this, in the conventional method of manufacturing a flying tail type rigid-flexible printed circuit board, like the steps S7 and S11, an etching process for removing the metal layer and the plating layer formed in the flexible domain F is performed whenever forming a build-up layer. Accordingly, there is a problem of an additional increase in manufacturing costs.

Further, like the steps S2 and SS, the insulating layer is made of a cured insulator so that the second insulating layer is not laminated on the flexible domain F whenever forming a build-up layer. In case of a cured insulator, there are problems such as deterioration of filling property and an additional increase in manufacturing costs due to a curing process.

SUMMARY OF THE INVENTION

The present invention has been invented in order to overcome the above-described problems and it is, therefore, an object of the present invention to provide a method of manufacturing a flying tail type rigid-flexible printed circuit board using a flexible insulator and a flying tail type rigid-flexible printed circuit board manufactured by the same.

In accordance with one aspect of the present invention to achieve the object, there is provided a method of manufacturing a flying tail type rigid-flexible printed circuit board including the steps of: providing a base substrate having a first inner circuit pattern layer on one or both surfaces; laminating a first insulating layer on a rigid domain R of the base substrate; laminating at least one circuit layer, which extends over the entire domain of the base substrate, on the first insulating layer; and removing a portion of the circuit layer, which corresponds to a flexible domain F, wherein the circuit layer includes a second insulating layer.

At this time, the first insulating layer is made of a rigid insulator, and the second insulating layer is made of a flexible insulator.

And, the rigid insulator is cured no flow prepreg.

Further, the method of manufacturing a flying tail type rigid-flexible printed circuit board further includes, after the step of providing the base substrate having the first inner circuit pattern layer on one or both surfaces, the step of attaching a coverlay to the first inner circuit pattern layer formed in the flexible domain F of the base substrate.

Further, the step of removing the portion of the circuit layer, which corresponds to the flexible domain F, is performed through the steps of processing a cavity on an edge of the flexible domain F adjacent to the rigid domain R; and removing a circuit layer pile remaining after processing the cavity.

Further, the step of processing the cavity on the edge of the flexible domain F adjacent to the rigid domain R is performed by a laser method or a routing method.

Further, the step of laminating the at least one circuit layer, which extends over the entire domain of the base substrate, on the first insulating layer is performed through the steps of laminating a metal layer which extends over the entire domain of the base substrate; forming a plating layer on the metal layer; forming a second inner circuit pattern layer by etching the metal layer and the plating layer along a circuit pattern; and laminating a second insulating layer, which extends over the entire domain of the base substrate, on the second inner circuit pattern layer.

Further, the method of manufacturing a flying tail type rigid-flexible printed circuit board further includes, after the step of laminating the metal layer which extends over the entire domain of the base substrate, the step of forming a via-hole by window-etching a portion of the metal layer to form a via-hole opening and irradiating laser to the via-hole opening.

Further, the method of manufacturing a flying tail type rigid-flexible printed circuit board further includes, after the step of laminating the metal layer which extends over the entire domain of the base substrate, the step of processing a through-hole which penetrates the entire first insulating layer and base substrate.

Further, the step of providing the base substrate having the first inner circuit pattern layer on one or both surfaces is performed through the steps of providing a flexible film having a metal layer on one or both surfaces; and forming the first inner circuit pattern layer by etching the metal layer.

Further, the method of manufacturing a flying tail type rigid-flexible printed circuit board further includes, after the step of laminating the at least one circuit layer, which extends over the entire domain of the base substrate, on the first insulating layer, the step of forming an outer circuit pattern layer on the outermost top surface of the circuit layer.

And, in accordance with another aspect of the present invention to achieve the object, there is provided a flying tail type rigid-flexible printed circuit board including: a base substrate having a first inner circuit pattern layer on one or both surfaces; a first insulating layer laminated on a rigid domain R of the base substrate; and at least one circuit layer formed on the first insulating layer and including a second insulating layer.

At this time, the first insulating layer is made of a rigid insulator, and the second insulating layer is made of a flexible insulator.

And, the rigid insulator is cured no flow prepreg.

Further, the flying tail type rigid-flexible printed circuit board further includes a coverlay attached to the first inner circuit pattern layer formed in a flexible domain F of the base substrate.

Further, the circuit layer consists of a lower second inner circuit pattern layer; and the second insulating layer which covers the second inner circuit pattern layer.

Further, the flying tail type rigid-flexible printed circuit board further includes an outer circuit pattern layer formed on the outermost top surface of the circuit layer.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIGS. 1 to 21 are process diagrams showing a method of manufacturing a flying tail type rigid-flexible printed circuit board in accordance with the present invention; and FIG. 22 is a cross-sectional view of a flying tail type rigid-flexible printed circuit board manufactured by the method of manufacturing a flying tail type rigid-flexible printed circuit board in accordance with the present invention.

DETAILED DESCRIPTION OF THE PREFERABLE EMBODIMENTS

Figure 23:
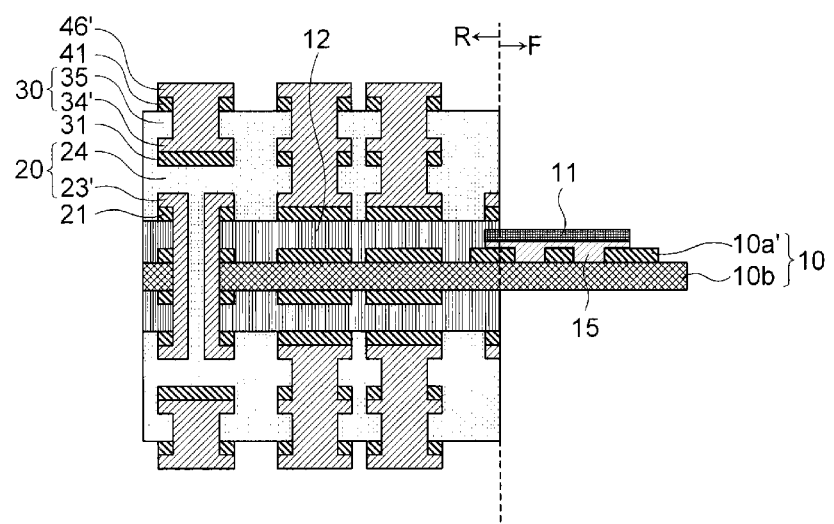
FIG. 23 is another cross-sectional view of a flying tail type rigid-flexible printed circuit board in accordance with the present invention.

Advantages and features of the present invention and methods of accomplishing the same will be apparent by referring to embodiments described below in detail in connection with the accompanying drawings. However, the present invention is not limited to the embodiments disclosed below and may be implemented in various different forms. The exemplary embodiments are provided only for completing the disclosure of the present invention and for fully representing the scope of the present invention to those skilled in the art. Like reference numerals refer to like elements throughout the specification.

Terms used herein are provided to explain embodiments, not limiting the present invention. Throughout this specification, the singular form includes the plural form unless the context clearly indicates otherwise. When terms "comprises" and/or "comprising" used herein do not preclude existence and addition of another component, step, operation and/or device, in addition to the above-mentioned component, step, operation and/or device.

Hereinafter, configuration and operational effect of the present invention will be described in detail with reference to the accompanying drawings.

FIGS. 1 to 21 are process diagrams showing a method of manufacturing a flying tail type rigid-flexible printed circuit board in accordance with the present invention.

First, a method of manufacturing a flying tail type rigid-flexible printed circuit board in accordance with the present invention performs the step of providing a base substrate having a first inner circuit pattern layer on one or both surfaces.

The base substrate 10 may be provided by performing the step of providing a flexible film 10b having a metal layer 10a on one or both surfaces as shown in FIG. 1 and the step of forming the first inner circuit pattern layer 10a' by etching the metal layer 10a as shown in FIG. 2.

Here, for example, the flexible film 10b may be made of polyimide resins, polyurethane resins, acrylate resins, and so on.

And, the first inner circuit pattern layer 10a' may be implemented by one of photolithography, E-beam lithography, focused ion beam lithography, dry etching, wet etching, and nano-imprinting.

In addition, the method of manufacturing a flying tail type rigid-flexible printed circuit board in accordance with the present invention may additionally perform, after the step of providing the base substrate 10 having the first inner circuit pattern layer 10' on one or both surfaces, as shown in FIG. 3, the step of attaching a coverlay 11 to the first inner circuit pattern layer 10a' formed in a flexible domain F of the base substrate 10.

The coverlay 11 plays a role of protecting the first inner circuit pattern layer 10a' formed in the flexible domain F of the base substrate 10 from external environment. For example, this coverlay 11 may be attached to the first inner circuit pattern layer 10a' by being pressed with a press after being temporarily bonded by hand using a soldering iron in a state of being preliminarily attached to the first inner circuit pattern layer 10a' using an adhesive layer 15(FIG. 23). A material of the coverlay 11 may be a polyimide film.

Next, as shown in FIG. 4, a first insulating layer 12 is laminated on a rigid domain R of the base substrate 10.

Here, the first insulating layer 12 may be made of a rigid insulator, and specifically, the rigid insulator may be cured no flow prepreg.

That is, the first insulating layer 12 is laminated only on the rigid domain R of the base substrate lousing no flow prepreg so as not to be laminated on the flexible domain F.

Next, the step of laminating at least one circuit layer, which extends over the entire domain of the base substrate 10, on the first insulating layer 12 is performed.

Specifically, first, a method of laminating the at least one circuit layer, which extends over the entire domain of the base substrate 10, on the first insulating layer 12, as shown in FIG. 5, performs the step of laminating a metal layer 21 which extends over the entire domain of the base substrate 10 (step S'1).

Since the first insulating layer 12 is laminated only on the rigid domain R of the base substrate 10, the metal layer 21 is laminated on the first insulating layer 12 while not being in contact with the first inner circuit pattern layer 10a' formed in the flexible domain F of the base substrate 10.

Additionally, the method of manufacturing a flying tail type rigid-flexible printed circuit board in accordance with the present invention, as shown in FIG. 6, may perform the step of processing a through-hole 22 which penetrates the entire first insulating layer 12 and base substrate 10. At this time, for example, the through-hole 22 may be processed using a computer numerical control (CNC) drill.

Next, as shown in FIG. 7, the step of forming a plating layer 23 on the metal layer 21 including an inner wall of the through-hole 22 (step S'2).

This plating layer 23 may be formed by one or a combination of electroless plating, electroplating, screen plating, sputtering, evaporation, ink-jetting, and dispensing using one of Cu, Ag, Sn, Au, Ni, and Pd.

Next, as shown in FIG. 8, the step of forming a second inner circuit pattern layer 23' by etching the metal layer 21 and the plating layer 23 along a circuit pattern (step S'3).

At this time, the second inner circuit pattern layer 23', like the first inner circuit pattern layer 10a', may be implemented by one of photolithography, E-beam lithography, focused ion beam lithography, dry etching, wet etching, and nano-imprinting.

Next, as shown in FIG. 9, a first circuit layer 20 is formed by performing the step (step S'4) of laminating a second insulating layer 24, which extends over the entire domain of the base substrate 10, on the second inner circuit pattern layer 23', and the circuit layer may be formed in a plurality of layers by repeatedly performing the steps S'1 to S'4.

Here, the second insulating layer 24 may be made of a flexible insulator. That is, unlike the first insulating layer 12 laminated on the rigid domain R of the base substrate 10, the second insulating layer 24 is laminated over the entire domain of the base substrate 10 using uncured typical prepreg, thus removing additional manufacturing costs due to curing and implementing a flying tail type rigid-flexible printed circuit board with improved filling property. Further, in terms of productivity, the step of laminating the second insulating layer 24 has an advantage of utilizing an existing production line as it is.

Meanwhile, in a process of laminating the circuit layer, the step of forming a via-hole 33 by laminating a metal layer 31, which extends over the entire domain of the base substrate as shown in FIG. 10, window-etching a portion of the metal layer 31 to form a via-hole opening 32 as shown in FIG. 11, and irradiating laser to the via-hole opening 32 as shown in FIG. 12 may be additionally performed.

Next, a second circuit layer 30 is formed by forming a plating layer 34 on the metal layer 31 including the via-hole 33 as shown in FIG. 13, etching the metal layer 31 and the plating layer 34 along a circuit pattern to form a second inner circuit pattern layer 34' as shown in FIG. 14, and laminating a second insulating layer 35 as shown in FIG. 15.

At this time, when forming the second inner circuit pattern layer 34', in order to process a cavity 45 of FIG. 19 in the circuit layer along an edge of the flexible domain F, it is preferred to form a cavity window 36 of FIG. 14 by etching both of the metal layer 31 and the plating layer 34 in the edge portion of the flexible domain F.

Next, the step of forming an outer circuit pattern layer on the outermost top surface of the circuit layer 20 and 30 is performed, and the step of removing a portion of the circuit layer 20 and 30, which corresponds to the flexible domain F.

When specifically looking into this, as shown in FIG. 16, a metal layer 41, which extends over the entire domain of the base substrate, is laminated on the outermost top surface of the circuit layer.

Next, as shown in FIG. 17, a via-hole opening 42 is formed by window-etching a portion of the metal layer 41. At this time, it is preferred to form a cavity opening 43 at the same time by window-etching the metal layer 41 on the edge of the flexible domain F. This is to perform the step of forming the cavity 45 of FIG. 19, which will be performed later.

Next, as shown in FIG. 18, a via-hole 44 is formed by irradiating laser to the via-hole opening 42.

Next, as shown in FIG. 19, the cavity 45 is processed on the edge of the flexible domain F adjacent to the rigid domain R. At this time, the cavity 45 may be processed by drilling such as a CNC drill and a C02 or Yag laser drill by using the metal layer 21 and the plating layer 23 of the flexible domain F as a stopper. Or, the cavity 45 may be processed by routing including a CNC router machine or a router bit or may be formed by being primarily processed with a router and secondarily processed with laser.

Next, as shown in FIG. 20, the step of forming a plating layer 46 on the metal layer 41 including inner walls of the via-hole 44 and the cavity 45 is performed, and as shown in FIG. 21, an outer circuit pattern layer 46' is formed by etching the metal layer 41 and the plating layer 46 along a circuit pattern. At this time, the plating layer on the inner wall of the cavity 45 is also removed by etching.

Finally, a flying tail type rigid-flexible printed circuit board in accordance with the present invention is finally completed by removing a circuit layer pile A remaining after processing the cavity 45.

Like this, when manufacturing a flying tail type rigid-flexible printed circuit board according to the method of manufacturing a flying tail type rigid-flexible printed circuit board in accordance with the present invention, unlike a conventional method of manufacturing a flying tail type rigid-flexible printed circuit board, since there is no need for an etching process for removing the metal layer and the plating layer corresponding to the flexible domain F, additional manufacturing costs due to an etching process are not required.

Further, when laminating the insulating layer, unlike the conventional method of manufacturing a flying tail type rigid-flexible printed circuit board, since it is not required to cure an insulator, additional costs due to a curing process are not required, and it is possible to implement a flying tail type rigid-flexible printed circuit board with improved filling property by laminating the insulating layer using an uncured insulator.

Now, a structure of a flying tail type rigid-flexible printed circuit board manufactured by the method of manufacturing a flying tail type rigid-flexible printed circuit board in accordance with the present invention will be specifically described.

FIG. 22 is a cross-sectional view of a flying tail type rigid-flexible printed circuit board manufactured by the method of manufacturing a flying tail type rigid-flexible printed circuit board in accordance with the present invention.

Referring to FIG. 22, a flying tail type rigid-flexible printed circuit board manufactured by the method of manufacturing a flying tail type rigid-flexible printed circuit board in accordance with the present invention includes a base substrate 10, a first insulating layer 12 laminated on a rigid domain R of the base substrate 10, and at least one circuit layer 20 and 30 formed on the first insulating layer 12 and including a second insulating layer 24 and 35.

In addition, the flying tail type rigid-flexible printed circuit board may further include a coverlay 11 attached to a first inner circuit pattern layer formed in a flexible domain F of the base substrate 10.

In the base substrate 10, a first inner circuit pattern layer 10a' is formed on one or both surfaces of a flexible film 10b.

Specifically, the circuit layer may consist of a lower second inner circuit pattern layer 23' and 34' and the second insulating layer 24 and 35 which covers the second inner circuit pattern layer 23' and 34'. The second inner circuit pattern layer 23' and 34' consists of a metal layer 21 and 31 and a plating layer.

Here, while the first insulating layer 12 is made of a rigid insulator, that is, cured no flow prepreg, the second insulating layer 24 and 35 is made of a flexible insulator, that is, uncured typical prepreg.

Meanwhile, the flying tail type rigid-flexible printed circuit board may additionally include an outer circuit pattern layer 46' formed on the outermost top surface of the circuit layer.

According to the flying tail type rigid-flexible printed circuit board and the method of manufacturing a flying tail type rigid-flexible printed circuit board manufactured by the same, unlike the conventional method of manufacturing a flying tail type rigid-flexible printed circuit board, since there is no need for an etching process for removing the metal layer and the plating layer corresponding to the flexible domain F, additional manufacturing costs due to an etching process are not required.

Further, according to the flying tail type rigid-flexible printed circuit board and the method of manufacturing a flying tail type rigid-flexible printed circuit board manufactured by the same, when laminating the insulating layer, unlike the conventional method of manufacturing a flying tail type rigid-flexible printed circuit board, since it is not required to cure an insulator, additional manufacturing costs due to a curing process are not required, and it is possible to implement a flying tail type rigid-flexible printed circuit board with improved filling property by laminating the insulating layer using an uncured insulator.

Further, in terms of productivity, there is an advantage of utilizing an existing production line as it is.

The foregoing description illustrates the present invention. Additionally, the foregoing description shows and explains only the preferred embodiments of the present invention, but it is to be understood that the present invention is capable of use in various other combinations, modifications, and environments and is capable of changes and modifications within the scope of the inventive concept as expressed herein, commensurate with the above teachings and/or the skill or knowledge of the related art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A rigid-flexible printed circuit board comprising:

a core layer including a flexible film having a first circuit pattern layer on one or both surfaces, the flexible film has an area corresponding to an area of the rigid-flexible printed circuit board and is integrally formed;

a first insulating layer laminated on a rigid portion of the core layer to expose the first circuit pattern layer on a flexible portion of the core layer and covering the first circuit pattern layer on a rigid portion of the core layer;

a residual metal pattern disposed on the first insulating layer to be positioned on the rigid portion, which is adjacent to the flexible portion to be exposed facing the flexible portion;

a second circuit pattern layer disposed on the first insulating layer;

a second insulating layer covering the second circuit pattern layer and the residual metal pattern;

a third circuit pattern layer disposed on the second insulating layer;

a third insulating layer covering the third circuit pattern layer; and a coverlay attached to the first circuit pattern layer on the flexible portion of the core layer by applying an adhesive layer between the coverlay and the first circuit pattern layer, wherein the residual metal pattern has an exposed surface facing the flexible portion and the exposed surface is an etched surface, and wherein the second insulating layer and third insulating layer have exposed surfaces that are facing the flexible portion and are substantially coplanar with each other, wherein the coverlay has an exposed surface on the flexible portion and a portion extending between the first insulating layer and the first circuit pattern layer on the rigid portion of the core layer.

2. The rigid-flexible printed circuit board according to claim 1, further comprising:

an outer circuit pattern layer disposed on the outermost top surface of the third insulating layer.

3. A rigid-flexible printed circuit board comprising:

a core layer including a flexible film having a first circuit pattern layer on one or both surfaces and divided into a rigid portion and a flexible portion, the flexible film has an area corresponding to an area of the rigid-flexible printed circuit board and is integrally formed;

a first insulating layer disposed on the core layer to expose the first circuit pattern layer on the flexible portion of the core layer and covering the first circuit pattern layer on the rigid portion of the core layer;

a second circuit pattern layer disposed on the first insulating layer;

a second insulating layer disposed on the first insulating layer to cover the second circuit pattern layer;

a residual metal pattern disposed between the first and the second insulating layers to be exposed on side surfaces of the first and the second insulating layers facing the flexible portion, the residual metal pattern having a same material as that of the second circuit pattern layer;

a coverlay attached to the first circuit pattern layer on the flexible portion of the core layer by applying an adhesive layer between the coverlay and the first circuit pattern layer; and a plurality of conductive vias connecting to either one or both of the first and second circuit pattern layers;

wherein the flexible portion of the core layer is not covered by the residual metal pattern, and the plurality of conductive vias are not directly connected to the residual metal pattern, wherein the coverlay has an exposed surface on the flexible portion and a portion extending between the first insulating layer and the first circuit pattern layer on the rigid portion of the core layer.

4. The rigid-flexible printed circuit board according to claim 3, further comprising a third circuit pattern layer disposed on the second insulating layer and a third insulating layer disposed on the second insulating layer to cover the second circuit pattern layer.

5. The rigid-flexible printed circuit board according to claim 4, wherein the third circuit pattern layer is electrically connected to at least one of the first and the second circuit pattern layers through a hole penetrating at least the second insulating layer.

6. The rigid-flexible printed circuit board according to claim 3, wherein the second circuit pattern layer is electrically connected to the first circuit pattern layer through a hole penetrating at least the first insulating layer.

* * * * *